(12) United States Patent
Mayya et al.

(10) Patent No.: US 8,735,053 B2
(45) Date of Patent: May 27, 2014

(54) METHODS OF FORMING PHOTORESIST PATTERNS

(75) Inventors: Subramanya Mayya, Suwon-si (KR); Takahiro Yasue, Suwon-si (KR); Seok-hwan Oh, Seoul (KR); Yool Kang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 276 days.

(21) Appl. No.: 13/099,910

(22) Filed: May 3, 2011

(65) Prior Publication Data
US 2011/0275020 A1    Nov. 10, 2011

(30) Foreign Application Priority Data
May 3, 2010 (KR) .................. 10-2010-0041433

(51) Int. Cl.
*G03F 7/26* (2006.01)
(52) U.S. Cl.
USPC .......................................... 430/324

(58) Field of Classification Search
USPC .................................. 430/322, 324
See application file for complete search history.

(56) References Cited

U.S. PATENT DOCUMENTS

| | | | |
|---|---|---|---|
| 4,701,390 A * | 10/1987 | Grunwald et al. | ............ 430/325 |
| 6,764,946 B1 | 7/2004 | Amblard | |
| 7,214,474 B2 | 5/2007 | Deng | |

FOREIGN PATENT DOCUMENTS

| | | |
|---|---|---|
| JP | 09043838 | 2/1997 |
| KR | 100594940 B1 | 6/2006 |

* cited by examiner

*Primary Examiner* — Kathleen Duda
(74) *Attorney, Agent, or Firm* — Harness Dickey & Pierce, P.L.C.

(57) ABSTRACT

Methods of forming photoresist patterns may include forming a photoresist layer on a substrate, exposing the photoresist layer using an exposure mask, forming a preliminary pattern by developing the exposed photoresist layer and treating a surface of the preliminary pattern using a treatment agent that includes a coating polymer.

18 Claims, 5 Drawing Sheets

(i)

(ii)

(i)

(ii)

METHODS OF FORMING PHOTORESIST PATTERNS

CROSS-REFERENCE TO RELATED APPLICATION

This application claims priority to Korean Patent Application No. 10-2010-0041433, filed on May 3, 2010, in the Korean Intellectual Property Office (KIPO), the entire contents of which is incorporated herein by reference.

BACKGROUND

1. Field

Example embodiments of the inventive concepts relate to methods of forming photoresist patterns.

2. Description of the Related Art

Methods of forming photoresist patterns and using the photoresist patterns as etch masks are widely used in semiconductor manufacturing processes. As the size of photoresist patterns decrease, in particular line-and-space patterns, the width of lines and gaps between lines are reduced. As line-and-space patterns are reduced, line width roughness (LWR) may increase.

SUMMARY

At least some example embodiments of the inventive concepts may provide methods of forming photoresist patterns in which a line-width roughness (LWR) is improved.

According to example embodiments of the inventive concepts, a method of forming a photoresist pattern includes forming a photoresist layer on a substrate, exposing the photoresist layer using an exposure mask, forming a preliminary pattern by developing the exposed photoresist layer and treating a surface of the preliminary pattern using a treatment agent that includes a coating polymer.

The method may further include treating the surface-treated preliminary pattern using a washing agent that comprises a surfactant to form a final pattern having a line-width roughness (LWR) better than that of the preliminary pattern. The coating polymer may be a water soluble polymer. The coating polymer may be at least one selected from the group consisting of polystyrene sulfonate, polyvinyl sulfonate, polyethyleneimine, polyhydroxystyrene, poly(acrylic acid), polyvinylpyrrolidone, polydiallyl dimethyl ammonium chloride, a mixture of these materials, and a copolymer of these materials.

The surfactant may be a cationic surfactant, an anionic surfactant, and/or an amphoteric surfactant, and may be at least one selected from the group consisting of alkyl trimethyl ammonium chloride, alkyl trimethyl ammonium bromide, alkyl trimethyl fluoride, dialkyl dimethyl ammonium chloride, hydrogenated tallow alkyltrimethyl ammonium chloride, ditallow alkyldimethyl ammonium chloride cocamidopropyl dimethylamine, stearamidopropyl dimethylamine, beheniramidopropyl dimethylamine, oleamidopropyl dimethylamine, isostearamidopropyl dimethylamine, cetyltrimethyl ammonium bromide (CTAB), cetyl trimethyl ammonium chloride, stearyl trimethyl ammonium chloride, distearyl dimethyl ammonium chloride, dicetyl dimethyl ammonium chloride, alginate-based polymer, sulfonate-based sodium dodecyl sulfate, linear alkylbenzene sulfonate, alpha olefin sulfonate, alkyl sulfate ester, poly oxyethylene alkyl ester sulfonate, alpha-sulfo fatty acid ester, alkylbenzene sulfonate, alkyl sulfate, alkyl ether sulfate, alpha olefin sulfonate, alkane sulfonate, hydroxyl alkane sulfonate, fatty acid monoglyceride sulfate, alkyl glycerol ether sulfate, alkali metal salt, alkali earth metal salt, acylglutamate, acyltaurate, acyl isethionate (SCI), sodium lauryl sulfate (SLS), sodium lauryl ether sulfate (SLES), linear alkylbenzene sulfonate (LAS), mono-alkyl phosphate (MAP), alkylamidopropyl betaine, alkyldimethyl betaine, alkyl amphoacetate, and alkyl ampho-di-acetate.

According to an example embodiment, the coating polymer may be at least one selected from the group consisting of polystyrene sulfonate, polyvinyl sulfonate, polyhydroxystyrene, poly(acrylic acid), a mixture of these materials, and a copolymer of these materials, and the surfactant is a cationic surfactant or an amphoteric surfactant. According to another example embodiment, the coating polymer may be at least one selected from the group consisting of polyethyleneimine, polyvinylpyrrolidone, polydiallyl dimethyl ammonium chloride, a mixture of these materials, and a copolymer of these materials, and the surfactant is an anionic surfactant or an amphoteric surfactant. According to yet another example embodiment, the coating polymer may be at least one selected from the group consisting of polystyrene sulfonate, polyhydroxystyrene, poly(acrylic acid), a mixture of these materials, and a copolymer of these materials, and the surfactant is cetyltrimethyl ammonium bromide (CTAB).

The treatment agent and the washing agent may further include alcohol, and the alcohol may be a primary alcohol or a secondary alcohol. The concentration of the surfactant in the washing agent may be in a range from about 1 ppm to about 50 ppm, and the concentration of the coating polymer in the treatment agent may be in a range from about 0.1 weight % to about 5 weight %.

According to other example embodiments of the inventive concepts a method of forming a photoresist pattern includes forming a photoresist layer on a substrate, exposing the photoresist layer using an exposure mask and developing the photoresist layer using a developing agent that comprises a coating polymer and a developing compound to form a preliminary pattern. The method may further include treating the preliminary pattern using a washing agent that comprises a surfactant to form a final pattern having a line-width roughness (LWR) better than that of the preliminary pattern. In particular, the preliminary pattern may be a line-and-space pattern.

The developing of the photoresist layer may include forming the preliminary pattern in which the coating polymer is bonded on a surface of the photoresist layer remaining after developing by the developing compound. The coating polymer may be a water soluble polymer. The coating polymer may be at least one selected from the group consisting of polystyrene sulfonate, polyvinyl sulfonate, polyethyleneimine, polyhydroxystyrene, poly(acrylic acid), polyvinylpyrrolidone, polydiallyl dimethyl ammonium chloride, a compound of these materials, and a copolymer of these materials. The method may further include baking the photoresist layer immediately after the forming of the photoresist layer. The method may further include baking the photoresist layer immediately after the exposing of the photoresist layer.

According to example embodiments, a method of forming a pattern includes forming a first pattern including a base material coated with a polymer, and washing the first pattern with a washing agent to form a second pattern. The washing agent may include a surfactant.

BRIEF DESCRIPTION OF THE DRAWINGS

Example embodiments will be more clearly understood from the following brief description taken in conjunction with the accompanying drawings. FIGS. 1A-2D represent non-limiting, example embodiments as described herein.

FIGS. 1A-1E are cross-sectional diagrams and plan views illustrating methods of forming photoresist patterns according to example embodiments of the inventive concepts; and FIGS. 2A-2D are cross-sectional diagrams and plan views illustrating methods of forming photoresist patterns according to other example embodiments of the inventive concepts.

Figure 1A:
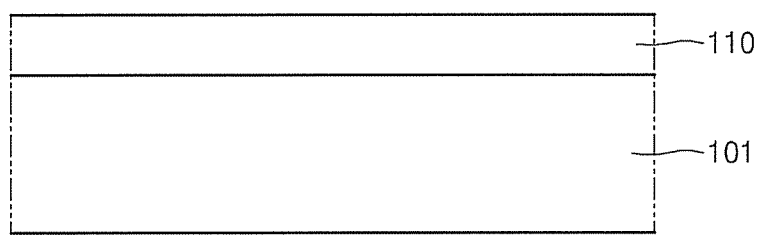

It should be noted that these figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

According to example embodiments of the inventive concepts methods of forming photoresist patterns may include forming a photoresist layer on a substrate, exposing the photoresist layer using an exposure mask, forming a preliminary pattern by developing the exposed photoresist layer, and treating a surface of the preliminary pattern using a treatment agent that includes a coating polymer.

FIGS. 1A-1E are cross-sectional diagrams and plan views illustrating methods of forming photoresist patterns according to example embodiments of the inventive concepts. Referring to FIG. 1A, a photoresist layer 110 may be formed on a substrate 101. The substrate 101 may be a semiconductor substrate, for example, a silicon monocrystal substrate, a silicon-on-insulator (SOI) substrate, a germanium (Ge) substrate, a gallium-phosphide (GaP) substrate, and/or a gallium-arsenide (GaAs) substrate, and not limited thereto. The substrate 101 may be a bare substrate, a substrate including an activation region defined by a device isolation film (not shown), and/or a substrate including a device (e.g., a transistor) formed in the substrate and/or on a surface thereof.

The photoresist layer 110 may be formed of a photoresist material, characteristics of which may be changed by irradiating a light of a corresponding wavelength onto the photoresist material, but is not limited thereto. The photoresist layer 110 may be formed on the substrate 101 by using, for example, a spin coating method, a spray coating method, and/or a dip coating method, but is not limited thereto. After the photoresist layer 110 is formed by using a spin coating method, a bake that may be referred to as a post-apply bake (PAB) (e.g., a pre-bake/softbake) may be performed. The PAB may reduce a solvent content of the photoresist layer 110 and may allow the photoresist layer 110 to adhere (e.g., firmly fix) to the substrate 101.

Figure 1B:
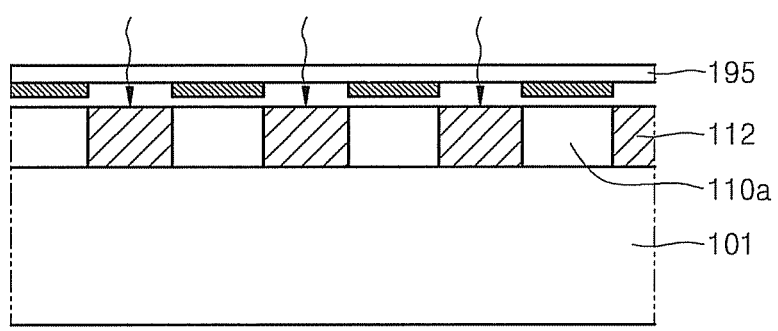

Referring to FIG. 1B, an exposure mask 195 may be aligned with respect to the substrate 101, and the photoresist layer 110 may be exposed to form a latent image of a preliminary pattern 112 that is sensitized (e.g., exposed) and a portion of a photoresist layer 110a that is not sensitized. The preliminary pattern 112 is illustrated as a line-and-space pattern, but is not limited thereto, and may be another type of pattern (e.g., a via pattern). After exposing the photoresist layer 110, a bake that may be referred to as a post-exposure bake (PEB) may be performed. The PEB may be performed at a temperature of about 100° C. to about 120° C. for about 20 seconds to about 3 minutes. The PEB may relieve stress in the photoresist layer 110, may remove acid generated by a photo acid generator (PAG) and may increase adhesion of the photoresist layer 110 to the substrate 101.

Figure 1C:
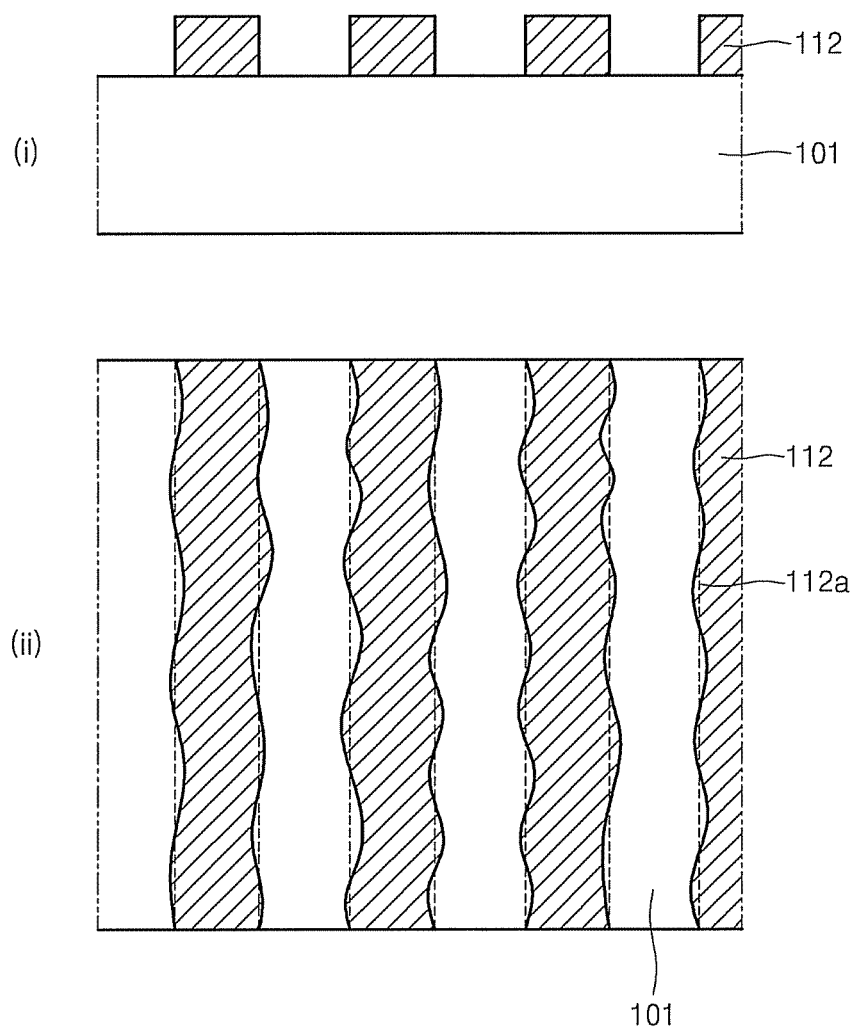

Referring to FIG. 1C (i), the preliminary pattern 112 may be formed by developing the exposed photoresist layer 110. In FIGS. 1B and 1C, although a negative photoresist in which the exposed regions (corresponding to the preliminary pattern 112) may remain on the substrate 101 and the unexposed regions (corresponding to the portion of the photoresist layer 110a) may be removed is described as an example, example embodiments of the inventive concepts are not limited thereto, and a positive photoresist may be used. A compound for developing the photoresist layer 110 may be appropriately selected according to the material of the photoresist layer 110. For example, a developer such as tetramethylammonium hydroxide (TMAH) may be used.

FIG. 1C (ii) is a plan view of the structure shown in FIG. 1C (i). The preliminary pattern 112 may have a non-uniform width difference from a target pattern 112a. A difference between a formed pattern and a target pattern may be quantitatively analyzed using a line-width roughness (LWR) and/or a line-edge roughness (LER). In general, the LWR may indicate a degree of deviation of overall line-width of lines in the formed pattern from overall line-width of lines in the target pattern. The LER may indicate a degree of deviation of an edge of the formed pattern from an edge of the target pattern. Methods of calculating LWR and LER are well known in the art and detailed descriptions thereof may be omitted. When the LWR and LER are qualitatively interpreted, in FIG. 1C (ii), the closer the edge of the preliminary pattern 112 is to the target pattern 112a, the lower the LWR and the LER, and the farther the edge of the preliminary pattern 112 from the edge of the target pattern 112a the greater the LWR and the LER.

Figure 1D:
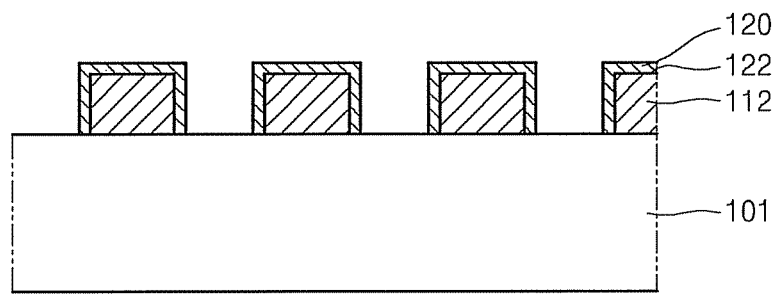

Referring to FIG. 1D, a polymer smoothing layer 120 including a coating polymer (e.g., mainly a coating polymer) may be formed on a surface of the preliminary pattern 112 by treating the surface of the preliminary pattern 112 using a treatment agent. It is believed that the polymer smoothing layer 120 may form an inter-molecular bond or an ionic bond with the preliminary pattern 112 at an interface 122 between the polymer smoothing layer 120 and the preliminary pattern 112. The polymer smoothing layer 120 may not form a covalent bond with the preliminary pattern 112 but may form a hydrogen bond, a van der Waals bond, and/or an ionic bond. However, example embodiments of the inventive concepts are not limited or bound by any particular bonding theory. The coating polymer may be a water soluble polymer, for example, at least one of polystyrene sulfonate, polyvinyl sulfonate, polyethyleneimine, poly hydroxystyrene, poly (acrylic acid), polyvinylpyrrolidone, polydiallyldimethyl ammonium chloride, a mixture of these materials, and a copolymer of these materials.

The treatment agent may include a solvent to disperse the coating polymer and to provide fluidity. The solvent may be, for example, water, and/or a polar organic solvent that is mutually miscible and does not react with the coating polymer. In the treatment agent, the concentration of the coating polymer may be, for example, about 0.1 weight % to about 5 weight %, about 0.5 weight % to about 4 weight %, or about 1 weight % to about 3 weight %. If the concentration of the coating polymer is too low, the polymer smoothing layer 120 may not be formed well. If the concentration of the coating polymer is too high, the polymer smoothing layer 120 may be formed excessively thick, which may be uneconomical. The treatment agent may include alcohol. The alcohol may be a primary alcohol or a secondary alcohol. For example, the alcohol may be methanol, ethanol, iso-propanol, 1-propanol, 1-butanol, and/or iso-butanol. The alcohol may facilitate adhesion of the coating polymer to the surface of the preliminary pattern 112 and may form a compact polymer smoothing layer 120. The content of alcohol in the treatment agent may be about 0.5 volume % to about 3 volume %.

Figure 1E:
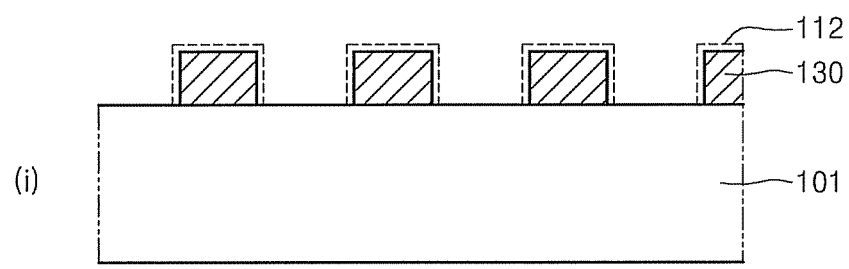
Figure 1E:
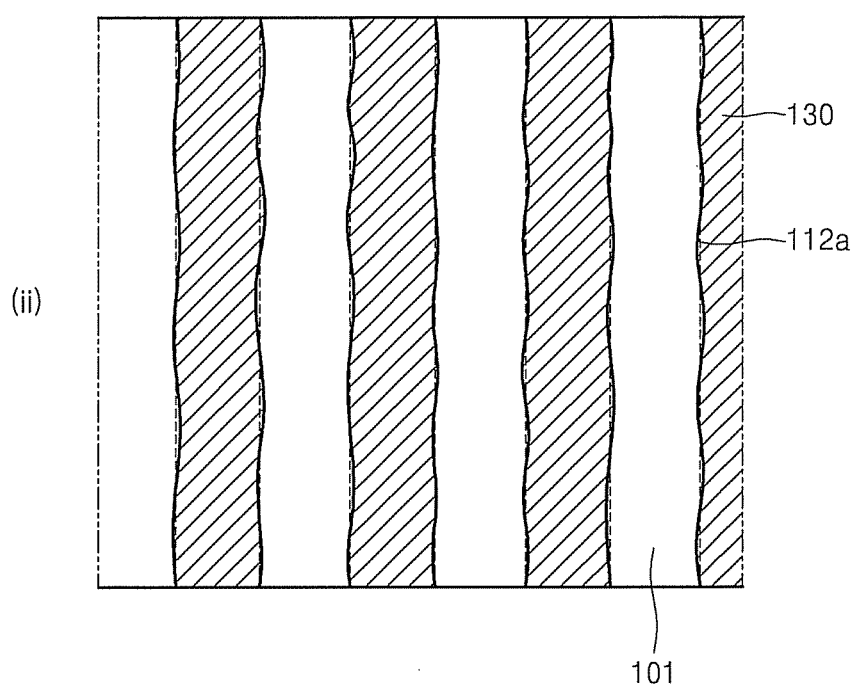

Referring to FIG. 1E (i), a final pattern 130 with an improved LWR in comparison to the preliminary pattern 112 may be formed by treating the preliminary pattern 112 on which the polymer smoothing layer 120 is formed using a washing agent. As shown in FIG. 1E (i), a profile of the final (or second) pattern 130 may be smaller (e.g., slightly smaller) than that of the preliminary (or first) pattern 112. In other words, a cross-sectional area of the final or second pattern is smaller than a cross-sectional area of the preliminary or first pattern. The majority of the polymer smoothing layer 120 may be removed by the washing agent. A portion of the surface of the preliminary pattern 112 may be removed together with the polymer smoothing layer 120. However, example embodiments of the inventive concepts are not limited to any particular theory with respect to formation of the final pattern 130. In FIG. 1E (i), it may be illustrated that the upper surface and the side surfaces of the preliminary pattern 112 may be approximately equally reduced to form the final pattern 130. However, it is noted that the degree to which each of the surfaces is reduced may not necessarily be the same.

FIG. 1E (ii) is a plan view of FIG. 1E (i). An LWR of the pattern in FIG. 1E (ii) may be relatively improved in comparison to the pattern in FIG. 1C (ii).

The washing agent may include a surfactant. The surfactant may be a cationic surfactant, an anionic surfactant and/or an amphoteric surfactant. The concentration of the surfactant in the washing agent may be about 1 ppm to about 50 ppm, about 5 ppm to about 45 ppm, or about 10 ppm to about 40 ppm. When the concentration of the surfactant in the washing agent is too low, the washing may not be sufficiently performed, and the polymer smoothing layer 120 may not be sufficiently removed. If the concentration of the surfactant in the washing agent is too high, it may be uneconomical.

A cationic surfactant may be, for example, a quaternary ammonium compound (e.g., alkyl trimethyl ammonium chloride, alkyl trimethyl ammonium bromide, alkyl trimethyl fluoride, dialkyl dimethyl ammonium chloride, hydrogenated tallow alkyl trimethyl ammonium chloride, and/or ditallow alkyl dimethyl ammonium chloride) and/or a tertiary amidoamine (e.g., cocamidopropyl dimethylamine, stearamidopropyl dimethylamine, beheniramidopropyl dimethylamine, oleamidopropyl dimethylamine, and/or isostearamidopropyl dimethylamine). The cationic surfactant may be, for example, cetyl trimethyl ammonium bromide (CTAB), cetyl trimethyl ammonium chloride, stearyl trimethyl ammonium chloride, distearyl dimethyl ammonium chloride, and/or dicetyl dimethyl ammonium chloride.

An anionic surfactant may be, for example, alginate-based polymer, sulfonate-based sodium dodecyl sulfate, linear alkylbenzene sulfonate, alpha olefin sulfonate, alkyl sulfate ester, poly oxyethylene alkyl ester sulfonate, alpha-sulfo fatty acid ester, alkylbenzene sulfonate, alkyl sulfate, alkyl ether sulfate, alpha olefin sulfonate, alkane sulfonate, hydroxyl alkane sulfonate, fatty acid monoglyceride sulfate, alkyl glycerol ether sulfate, alkali metal salt, alkali earth metal salt, acylglutamate, acyltaurate, acyl isethionate (SCI), sodium lauryl sulfate (SLS), sodium lauryl ether sulfate (SLES), linear alkylbenzene sulfonate (LAS), and/or mono-alkyl phosphate (MAP). An amphoteric surfactant may be, for example, alkylamidopropyl betaine, alkyldimethyl betaine, alkyl amphoacetate, and/or alkyl ampho-di-acetate. The cationic surfactants, the anionic surfactants, and the amphoteric surfactants described above are all examples, and example embodiments of the inventive concepts are not limited thereto.

The coating polymer and the surfactant may be appropriately chosen to be mixed rather than arbitrarily combined. For example, a coating polymer that may be negatively charged (e.g., polystyrene sulfonate, polyvinyl sulfonate, and/or a poly(acrylic acid)) may be mixed in a combination with a cationic surfactant and/or an amphoteric surfactant. For example, a coating polymer that may be positively charged (e.g., polyethylene imine, polyvinylpyrrolidone, and/or polydiaryl dimethyl ammonium chloride (polyDADMAC)) may be mixed in a combination with an anionic surfactant and/or an amphoteric surfactant. For example, polystyrene sulfonate as a coating polymer and CTAB as a surfactant may be mixed to form a washing agent.

The washing agent may include an alcohol. The alcohol may be a primary alcohol or a secondary alcohol. The alcohol may be, for example, methanol, ethanol, iso-propanol, 1-propanol, 1-butanol, and/or iso-butanol. An alcohol in the washing agent may reinforce the washing performance of the washing agent. The content of alcohol in the washing agent may be about 0.5 volume % to about 3 volume %. The final pattern 130 may be used as an etch mask in a process to etch the substrate 101 thereunder.

According to other example embodiments of the inventive concepts, methods of forming photoresist layers on a substrate may include forming a photoresist layer on a substrate, exposing the photoresist layer using an exposure mask, developing the photoresist layer using a developing agent that includes a developing compound and a coating polymer to form a preliminary pattern.

FIGS. 2A-2D are cross-sectional diagrams and plan views illustrating methods of forming photoresist patterns according to other example embodiments of the inventive concepts.

Figure 2A:
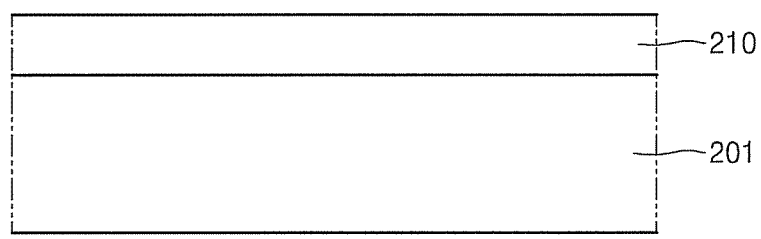

Referring to FIG. 2A, a photoresist layer 210 may be formed on a substrate 201. The substrate 201, the photoresist layer 210, and the methods of forming the photoresist layer 210 on the substrate 201 may be the same or similar to those described above with respect to FIG. 1A, and a description thereof may not be repeated. After forming the photoresist layer 210 on the substrate 201, a PAB may be performed to reduce the solvent content of the photoresist layer 210 and to adhere (e.g., firmly fix) the photoresist layer 210 to the substrate 201.

Figure 2B:
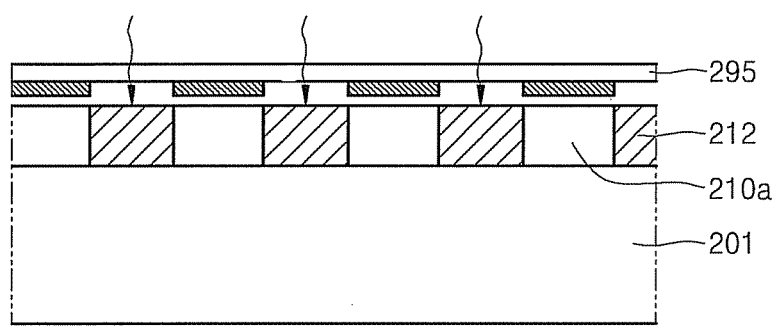

Referring to FIG. 2B, an exposure mask 295 may be aligned with respect to the substrate 201, and the photoresist layer 210 may be exposed to form a latent image of a preliminary pattern 212 that is a sensitized portion of the photoresist layer and a portion of a photoresist layer 210a that may not be sensitized. The preliminary pattern 212 may be illustrated as a line-and-space type pattern, but is not limited thereto, and may be another type of pattern (e.g., a via pattern). A PEB may be performed. The PEB may be performed at a temperature of about 100° C. to about 120° C. for about 20 seconds to about 3 minutes. The PEB may relieve stress in the photoresist layer 210, may remove acid generated by a PAG during exposure, and may increase adhesion of the photoresist layer 210 to the substrate 201.

Figure 2C:
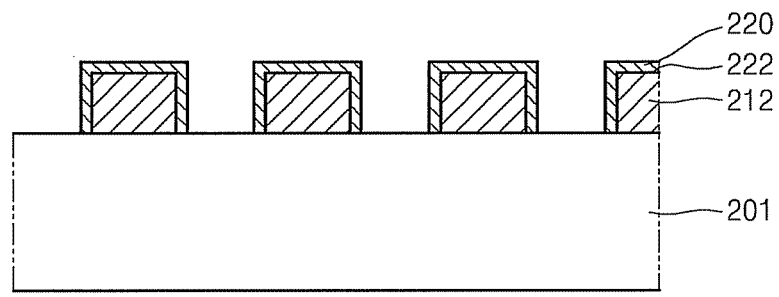

Referring to FIG. 2C, the preliminary pattern 212 may be formed by developing the exposed photoresist layer 210 using a developing agent. The developing agent may include a coating polymer and a developing compound. In FIG. 2C, a negative photoresist in which the exposed portions (corresponding to the preliminary pattern 212) may remain on the substrate 201 and the unexposed portions of the photoresist layer 210 (corresponding to the photoresist layer 210a) may be removed is described as an example, but a positive photoresist may also be used according to example embodiments of the inventive concepts. A developing compound included in the developing agent may be appropriately selected according to the material of the photoresist layer 210. For example, a developer such as tetramethylammonium hydroxide (TMAH) may be used.

When a negative photoresist is used, the developing compound may remove the unexposed portions (corresponding to the photoresist layer 210a) of the photoresist layer 210 while the coating polymer included in the developing agent may adhere to a surface of the exposed portions (corresponding to the preliminary pattern 212) of the photoresist layer 210 to form a polymer smoothing layer 220. It is believed that the polymer smoothing layer 220 may form an inter-molecular bond or an ionic bond with the preliminary pattern 212 at an interface 222 between the polymer smoothing layer 220 and the preliminary pattern 212. The polymer smoothing layer 220 may not form a covalent bond with the preliminary pattern 212 but may form a hydrogen bond, a van der Waals bond, and/or an ionic bond. However, example embodiments of the inventive concepts are not limited or bound by any particular bonding theory.

The coating polymer may be the same or similar to the coating polymer described above with respect to FIG. 1D, and a description thereof may not be repeated. The developing agent may include a solvent to disperse the developing compound and the coating polymer and to provide fluidity. The solvent may be, for example, water, and/or a polar organic solvent that may be mutually miscible with the developing compound and the coating polymer and does not react with the developing compound and the coating polymer. In the developing agent, the concentration of the coating polymer may be about 0.1 weight % to about 5 weight %, about 0.5 weight % to about 4 weight %, or about 1 weight % to about 3 weight %. If the concentration of the coating polymer is too low, the polymer smoothing layer 220 may not be formed well. Of the concentration of the coating polymer is too high, the polymer smoothing layer 220 may be formed excessively thick, which may be uneconomical.

The developing agent may include alcohol. The alcohol may be a primary alcohol or a secondary alcohol. For example, the alcohol may be methanol, ethanol, iso-propanol, 1-propanol, 1-butanol, and/or iso-butanol. The alcohol may facilitate adhesion of the coating polymer to a surface of the preliminary pattern 212 and may form a compact polymer smoothing layer 220. The content of the alcohol in the developing agent may be in a range from about 0.5 volume % to about 3 volume %. A washing process, for example, a reducing resist consumption (RRC) treatment, may be performed before and/or after the developing operation of forming the preliminary pattern 212 by developing the photoresist layer 210 using a developing agent. The RRC treatment may be performed by using deionized water.

Figure 2D:
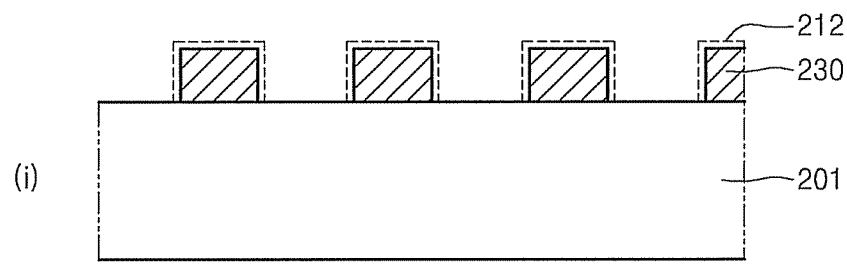
Figure 2D:
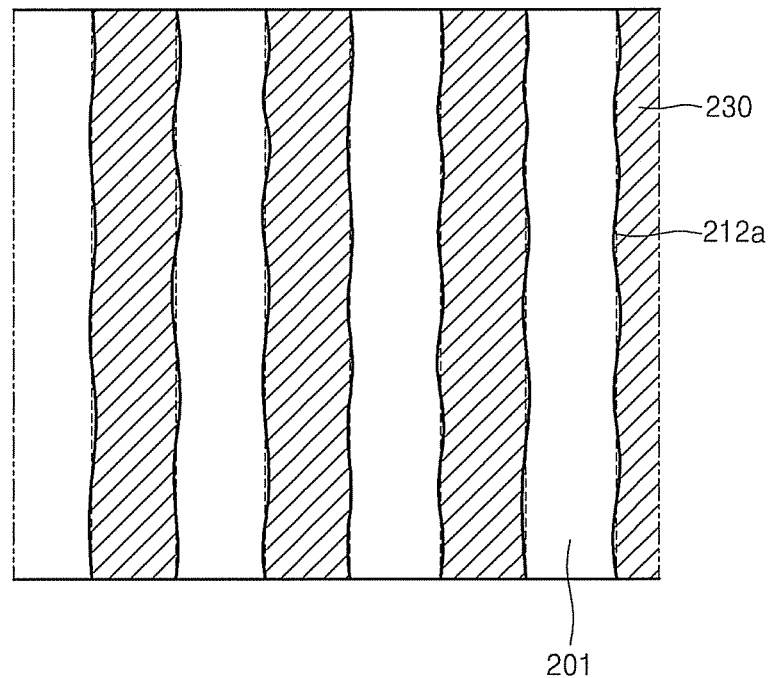

Referring to FIG. 2D (i), a final pattern 230 with an improved LWR in comparison to the preliminary pattern 212 may be obtained by treating the preliminary pattern 212 on which the polymer smoothing layer 220 is formed using a washing agent. A profile of the final pattern 230 may be smaller (e.g., slightly smaller) than that of the preliminary pattern 212. Most of the polymer smoothing layer 220 may be removed by the washing agent. A portion of the surface of the preliminary pattern 212 may be removed together with the polymer smoothing layer 220. However, example embodiments of the inventive concepts are not limited to any particular theory with respect to formation of the final pattern 130. In FIG. 2D (i), it may be illustrated that the upper surface and the side surfaces of the preliminary pattern 212 may be approximately equally reduced to form the final pattern 230. However, it is noted that the degree to which each of the surfaces is reduced may not necessarily be the same.

FIG. 2D (ii) is a plan view of FIG. 2D (i). An LWR of the pattern in FIG. 2D (ii) may be relatively improved in comparison to a photoresist pattern formed using a conventional method. The final pattern 130 may have a reduced non-uniform width difference from a target pattern 212a.

The washing agent may include a surfactant. Surfactants are described above with respect to FIGS. 1A-1E and a description thereof may not be repeated. In order to obtain a further LWR improvement effect, the coating polymer and the surfactant may be appropriately chosen to be mixed rather than arbitrarily combined. For example, a coating polymer that may be negatively charged (e.g., polystyrene sulfonate, polyvinyl sulfonate, and/or poly(acrylic acid)) may be mixed in a combination with a cationic surfactant and/or an amphoteric surfactant. For example, a coating polymer that may be positively charged (e.g., polyethylene imine, polyvinylpyrrolidone, and/or polydiaryl dimethyl ammonium chloride (polyDADMAC)) may be mixed in a combination with an anionic surfactant or an amphoteric surfactant. For example, polystyrene sulfonate as a coating polymer and CTAB as a surfactant may be mixed to form a washing agent.

The washing agent may include alcohol, and the kinds of alcohol, performances, and compositions are described above with respect to FIGS. 1A-1E and a description thereof may not be repeated. The final pattern 230 may be used as an etch mask in a process to etch the substrate 201 thereunder.

EXPERIMENTAL EXAMPLES

A standard ArF (e.g., 193 nm exposure) photoresist layer may be coated on a silicon substrate. A resultant product may be soft-baked at a temperature of 80° C. for 1 minute. A preliminary pattern of lines and spaces may be formed. LWRs of the preliminary patterns may be measured. Polystyrene sulfonate and CTAB may be used as a coating polymer and a surfactant, respectively. Iso-propyl alcohol may be used in a developing and washing process. Photoresist patterns may be formed by changing the content of each of the materials as follows.

TABLE 1

| | Polystyrene Sulfonate (wt %) | IPA (developer) (vol %) | CTAB (wt %) | IPA (wash) (vol %) |
|---|---|---|---|---|
| Experimental Example 1 | 0.1 | — | 0.01 | 2 |
| Experimental Example 2 | 0.1 | — | 0.02 | 2 |
| Experimental Example 3 | 0.1 | 1 | 0.01 | 2 |
| Experimental Example 4 | 0.1 | 2 | 0.02 | 2 |

After forming the above photoresist patterns, LWRs of each of the photoresist patterns may be measured. Differences ΔLWRs may be obtained using the LWRs of the preliminary patterns and those of the photoresist patterns. The results may be summarized in Table 2.

TABLE 2

| | LWR of the preliminary pattern (nm) | LWR of the photoresist pattern (nm) | ΔLWR (nm) |
|---|---|---|---|
| Experimental Example 1 | 9.7 | 7.0 | −2.7 |
| Experimental Example 2 | 10.9 | 7.5 | −3.4 |
| Experimental Example 3 | 10.6 | 6.8 | −3.8 |
| Experimental Example 4 | 10.1 | 7.0 | −3.1 |

As shown in Table 2, a method of forming a photoresist pattern according to example embodiments of the inventive concepts may improve the LWR of the photoresist pattern.

While example embodiments have been particularly shown and described, it will be understood by one of ordinary skill in the art that variations in form and detail may be made therein without departing from the spirit and scope of the claims.

What is claimed is:

1. A method of forming a pattern, the method comprising:
 forming a first pattern including a base material coated with a polymer; and
 washing the first pattern with a washing agent to form a second pattern,
 wherein a cross-sectional area of the second pattern is smaller than a cross-sectional area of the first pattern.

2. The method of claim 1, wherein the forming of the first pattern includes:
 forming a preliminary pattern including the base material, and
 depositing the polymer on the preliminary pattern.

3. The method of claim 1, wherein the first pattern includes the polymer bonded to a surface of the base material.

4. The method of claim 1, further comprising:
 using the second pattern as an etch mask.

5. The method of claim 1, wherein the washing of the pattern includes removing at least part of the base material and the polymer.

6. The method of claim 5, wherein a line-width roughness (LWR) of the second pattern is less than a LWR of the first pattern.

7. The method of claim 6, wherein the base material is a photoresist, and the forming of the first pattern includes depositing the polymer onto the preliminary pattern by using at least one of spin, spray and dip coating.

8. The method of claim 7, wherein the removing of the portion of the base material includes depositing the polymer on unremoved portions of the base material.

9. The method of claim 1, wherein the forming of the first pattern includes:
   forming a layer of the base material, and
   removing a portion of the base material to form the preliminary pattern.

10. The method of claim 1, wherein the washing agent includes a surfactant.

11. A method of forming a photoresist pattern, the method comprising:
   forming a photoresist layer on a substrate;
   exposing the photoresist layer using an exposure mask;
   forming a preliminary pattern by developing the exposed photoresist layer;
   after the forming a preliminary pattern, treating a surface of the preliminary pattern using a treatment agent that includes a coating polymer; and
   treating the surface-treated preliminary pattern using a washing agent that includes a surfactant to form a final pattern,
   wherein a cross-sectional area of the final pattern is smaller than a cross-sectional area of the preliminary pattern.

12. The method of claim 11, wherein the coating polymer is a water soluble polymer.

13. The method of claim 11, wherein a line-width roughness (LWR) of the final pattern is less than a LWR of the preliminary pattern.

14. The method of claim 11, wherein the surfactant is at least one of a cationic surfactant, an anionic surfactant, and an amphoteric surfactant.

15. The method of claim 11, wherein the surfactant is at least one of alkyl trimethyl ammonium chloride, alkyl trimethyl ammonium bromide, alkyl trimethyl fluoride, dialkyl dimethyl ammonium chloride, hydrogenated tallow alkyltrimethyl ammonium chloride, ditallow alkyldimethyl ammonium chloride, cocamidopropyl dimethylamine, stearamidopropyl dimethylamine, beheniramidopropyl dimethylamine, oleamidopropyl dimethylamine, isostearamidopropyl dimethylamine, cetyltrimethyl ammonium bromide (CTAB), cetyl trimethyl ammonium chloride, stearyl trimethyl ammonium chloride, distearyl dimethyl ammonium chloride, dicetyl dimethyl ammonium chloride, alginate-based polymer, sulfonate-based sodium dodecyl sulfate, linear alkylbenzene sulfonate, alpha olefin sulfonate, alkyl sulfate ester, poly oxyethylene alkyl ester sulfonate, alpha-sulfo fatty acid ester, alkylbenzene sulfonate, alkyl sulfate, alkyl ether sulfate, alpha olefin sulfonate, alkane sulfonate, hydroxyl alkane sulfonate, fatty acid monoglyceride sulfate, alkyl glycerol ether sulfate, alkali metal salt, alkali earth metal salt, acylglutamate, acyltaurate, acyl isethionate (SCI), sodium lauryl sulfate (SLS), sodium lauryl ether sulfate (SLES), linear alkylbenzene sulfonate (LAS), mono-alkyl phosphate (MAP), alkylamidopropyl betaine, alkyldimethyl betaine, alkyl amphoacetate, and alkyl ampho-di-acetate.

16. The method of claim 11, wherein the coating polymer is at least one of polystyrene sulfonate, polyhydroxystyrene, poly(acrylic acid), and a copolymer thereof, and the surfactant is cetyltrimethyl ammonium bromide (CTAB).

17. The method of claim 11, wherein a concentration of the surfactant in the washing agent is about 1 ppm to about 50 ppm.

18. The method of claim 11, wherein the treatment agent includes alcohol.

* * * * *